(12) United States Patent
Okuya et al.

(10) Patent No.: US 7,754,326 B2
(45) Date of Patent: Jul. 13, 2010

(54) RELEASE FILM, RELEASABLE CUSHION MATERIAL AND PROCESS FOR PRODUCING PRINTED BOARD

(75) Inventors: Tamao Okuya, Chiyoda-ku (JP); Hiroshi Aruga, Chiyoda-ku (JP); Masaru Yamauchi, Chiyoda-ku (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/245,139

(22) Filed: Oct. 3, 2008

(65) Prior Publication Data

US 2009/0042038 A1 Feb. 12, 2009

Related U.S. Application Data

(63) Continuation of application No. PCT/JP2007/056734, filed on Mar. 28, 2007.

(30) Foreign Application Priority Data

Apr. 5, 2006 (JP) ............................. 2006-104018

(51) Int. Cl.
*B32B 18/00* (2006.01)
*B32B 25/08* (2006.01)
*B32B 25/20* (2006.01)

(52) U.S. Cl. ...................... 428/336; 428/421; 428/447; 428/702

(58) Field of Classification Search ........................ None
See application file for complete search history.

(56) References Cited

U.S. PATENT DOCUMENTS 6,280,851 B1  8/2001  Pasternack et al.

(Continued)

FOREIGN PATENT DOCUMENTS

JP         10-296767         11/1998

(Continued)

OTHER PUBLICATIONS

JPO abstract of JP 2000-103888, Apr. 2000.*

(Continued)

*Primary Examiner*—Ramsey Zacharia
(74) *Attorney, Agent, or Firm*—Oblon, Spivak, McClelland, Maier & Neustadt, L.L.P.

(57) ABSTRACT

To provide a release film which does not need to be changed often for hot press and is easy to be changed; a releasable cushion material which can reduce the frequency of changing a cushion material main body; and a process for producing a printed board with good productivity and low cost.

A release film 10 which is to be provided on a surface of a cushion material made of silicone rubber, and which has a layer 14 containing Si on one side of a substrate 12 made of a fluororesin; a releasable cushion material wherein the release film is provided on a surface of the cushion material made of silicone rubber so that the layer containing Si is located on the cushion material side; and a process for producing a printed board wherein, when a laminate of a printed board main body and coverlay films is subjected to hot press as sandwiched between press boards, the release film is disposed on a surface of the cushion material of the coverlay film side so that the layer containing Si is located on the cushion material side.

4 Claims, 4 Drawing Sheets

U.S. PATENT DOCUMENTS 6,335,479 B1 * 1/2002 Yamada et al. .............. 136/251
2006/0068671 A1 3/2006 Yoshida

FOREIGN PATENT DOCUMENTS

| JP | 2000-052369 | 2/2000 |
|---|---|---|
| JP | 2000-103888 | 4/2000 |
| JP | 2001-315248 | 11/2001 |
| JP | 2002-144484 | 5/2002 |
| WO | WO 2005/115751 A1 | 12/2005 |

OTHER PUBLICATIONS

JPO abstract of JP 2001-315248, Nov. 2001.*
English language translation of JP 2001-315248 A (Nov. 2001).*

* cited by examiner

RELEASE FILM, RELEASABLE CUSHION MATERIAL AND PROCESS FOR PRODUCING PRINTED BOARD

TECHNICAL FIELD

The present invention relates to a release film to be provided on a surface of a cushion material for hot press made of silicone rubber, a releasable cushion material for hot press having the release film provided on its surface, and a process for producing a printed board by using the release film.

BACKGROUND ART

A flexible printed board is produced in such a manner that, for example, a flexible printed board main body having a circuit of copper foil formed on a polyimide substrate, is sandwiched between coverlay films having an adhesive coated on one side of each coverlay film to form a laminate, and the laminate is sandwiched between press boards and subjected to hot press to press-bond the coverlay films to the flexible printed board main body.

At the time of hot press, a cushion material made of silicone rubber is interposed between the laminate and the press boards in order to absorb unevenness of a reinforcing substrate and the circuit of the flexible printed board main body and to laminate the flexible printed board main body and coverlay films without any space.

Further, in order to prevent the adhesive of the coverlay film from adhering to the cushion material, a release film is located between the cushion material and the coverlay film.

However, since the release film does not adhere to the cushion material, it is necessary to set or change it for every hot press. Therefore, the productivity of the flexible printed board tends to be insufficient, and the cost tends to be high. On the other hand, if the release film is adhered to the cushion material by an adhesive, etc., the release film is strongly adhered to the cushion material by repetitive hot press, whereby the release film cannot easily be removed from the cushion material at the time of changing the release film having unevenness of the flexible printed board main body transferred.

Therefore, a mold releasable cushion material is suggested wherein a releasing property is imparted on the surface of the cushion material (Patent Documents 1 and 2).

However, with respect to the releasable cushion material, unevenness of the flexible printed board main body is transferred to the releasable cushion material by repeating hot press, whereby it is necessary to change the releasable cushion material often. Therefore, the productivity of the flexible printed board tends to be insufficient, and the cost tends to be high.

Patent Document 1: JP-A-2000-052369
Patent Document 2: JP-A-2002-144484

DISCLOSURE OF THE INVENTION

OBJECT TO BE ACCOMPLISHED BY THE INVENTION

The object of the present invention is to provide a release film which does not need to be set or changed for every hot press and is easy to be changed; a releasable cushion material which can reduce the frequency of changing a cushion material main body; and a process for producing a printed board which can produce a printed board with good productivity and low cost.

MEANS TO ACCOMPLISH THE OBJECT

The release film of the present invention to be provided on a surface of a cushion material made of silicone rubber, comprises a substrate made of a fluororesin and a layer containing Si formed on one side thereof.

The above layer containing Si is preferably a layer of oxides of Si and Sn formed by a sputtering method or a $SiO_x$ layer formed by a vacuum decomposition method, wherein x is from 1 to 2.

The releasable cushion material of the present invention comprises a cushion material made of silicone rubber and the release film of the present invention provided on a surface of the cushion material, so that the layer containing Si is located on the side of the cushion material.

The process for producing a printed board of the present invention, wherein, when a laminate of a printed board main body and coverlay films, is sandwiched between two press boards and subjected to hot press, cushion materials made of silicone rubber are interposed between the laminate and the press boards, and the mold release film of the present invention is disposed on a surface of the coverlay film side of at least one cushion material so that the layer containing Si is located on the cushion material side.

EFFECTS OF THE INVENTION

The release film of the present invention does not need to be set or changed for every hot press and is easy to be changed.

According to the releasable cushion material of the present invention, it is possible to reduce the frequency of changing the cushion material main body.

According to the process for producing a printed board of the present invention, it is possible to produce the printed board with good productivity and low cost.

MEANINGS OF SYMBOLS

Figure 1:
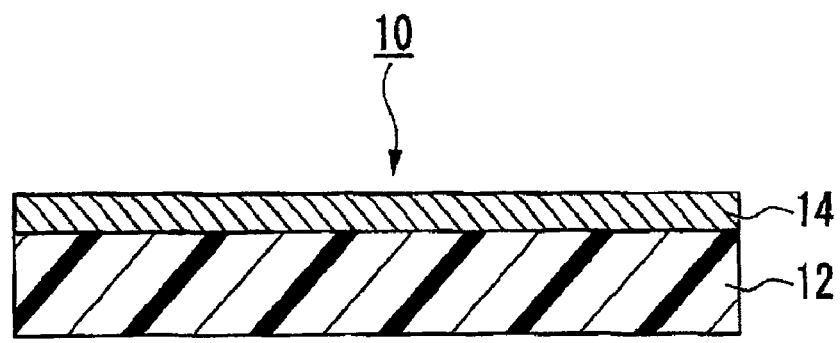
FIG. 1 is a schematic cross-sectional view illustrating one embodiment of the release film of the present invention.

10: Release film
12: Substrate
14: Layer containing Si
20: Releasable cushion material
22: Aluminum sheet
24: Cushion material
30: Flexible printed board main body (printed board main body)
32: Polyimide substrate
34: Circuit
40: Coverlay film
42: Adhesive layer
50: Press machine -continued

MEANINGS OF SYMBOLS

52: Press board
56: Glass fiber-reinforced PTFE film

BEST MODE FOR CARRYING OUT THE INVENTION

Release Film

The release film of the present invention is a release film to be provided on a surface of a cushion material for hot press made of silicone rubber.

FIG. 1 is a schematic cross-sectional view illustrating one embodiment of the release film of the present invention. A release film 10 is a film comprising a substrate 12 made of a fluororesin, and a layer 14 containing Si formed on one side thereof.

The substrate 12 is a film made of a fluororesin, and it is a film which exhibits a releasing property against an adhesive of a coverlay film of a printed board.

The above fluororesin is a thermoplastic resin containing fluorine in a molecular structural formula of the resin. The above fluororesin may, for example, be a tetrafluoroethylene resin, a chlorotrifluoroethylene resin, a vinylidene fluoride resin, a vinyl fluoride resin or a combination of such resins. From the viewpoint of the releasing property, a tetrafluoroethylene resin is preferred.

The tetrafluororesin may, for example, be polytetrafluoroethylene (PTFE), a tetrafluoroethylene/perfluoro(alkyl vinyl ether) copolymer (PFA), a tetrafluoroethylene/hexafluoropropylene/perfluoro(alkyl vinyl ether) copolymer (EPE), a tetrafluoroethylene/hexafluoropropylene copolymer (FEP) or a tetrafluoroethylene/ethylene copolymer (ETFE). From the viewpoint of moldability, PFA, ETFE, FEP or EPE is preferred, and from the viewpoint of excellent mechanical strength, ETFE is preferred.

ETFE is one having ethylene and tetrafluoroethylene as main components, and as a case requires, it may be one obtained by copolymerizing a small amount of a comonomer.

As the comonomer component, the following compound may be mentioned.

A fluorinated ethylene such as $CF_2$=CFCl or $CF_2$=$CH_2$, a fluorinated propylene such as $CF_2$=$CFCF_3$ or $CF_2$=$CHCF_3$, a $C_{2-10}$ fluorinated alkylethylene having a fluoroalkyl group such as $CH_2$=$CHC_2F_5$, $CH_2$=$CHC_4F_9$, $CH_2$=$CFC_4F_9$ or $CH_2$=CF$(CF_2)_3$H, a perfluoro(alkyl vinyl ether) of $CF_2$=CFO$(CF_2CFXO)_m R^f$ (wherein $R^f$ is a $C_{1-6}$ perfluoroalkyl group, X is a fluorine atom or a trifluoromethyl group, and n is an integer of from 1 to 5), or a vinyl ether having a group which is easily converted to a carboxylic acid group or a sulfonic acid group, such as $CF_2$=$CFOCF_2CF_2CF_2COOCH_3$ or $CF_2$=$CFOCF_2CF(CF_3)OCF_2CF_2SO_2F$.

In ETFE, the molar ratio of repeating units derived from ethylene/repeating units derived from tetrafluoroethylene is preferably from 40/60 to 70/30, particularly preferably from 40/60 to 60/40. Further, when ETFE contains repeating units derived from the comonomer, the content is preferably from 0.3 to 10 mol %, particularly preferably from 0.3 to 5 mol %, based on the repeating units (100 mol %) of all monomers.

The chlorotrifluoroethylene resin may, for example, be polychlorotrifluoroethylene (PCTFE) or an ethylene/chlorotrifluoroethylene copolymer (ECTFE).

As a case requires, in the substrate 12, a thermoplastic resin other than a fluororesin, a known additive, etc. may be contained within a range where the releasing property is not deteriorated.

The thickness of the substrate 12 is preferably from 5 to 300 μm, particularly preferably from 25 to 100 μm.

The layer 14 containing Si is a layer having a high affinity for a cushion material made of silicone rubber. As the layer 14 containing Si, for example, a layer of oxides of metals including Si may be mentioned.

The oxides may, for example, be $SiO_x$ (wherein x is from 1 to 2), oxides of Si and Sn, oxides of Si and Zr, oxides of Si and Ti, oxides of Si and Ta, oxides of Si and Nb, oxides of Si and Zn, or oxides of Si, Sn and Ti.

The layer of oxides is preferably a layer having $SiO_x$ (wherein x is from 1 to 2) (hereinafter referred to $SiO_x$ layer) as a main component or a layer containing oxides of Si and Sn as main components (hereinafter referred to as STO layer), from the viewpoint of adhesion to the cushion material. As the oxides of Si and Sn forming a STO layer, a mixture of $SiO_2$ and $SnO_2$ is preferred. Further, the STO layer preferably contains an oxide of a metal such as Zr, Ti, Ta, Nb or Zn.

The content of Si in the $SiO_x$ layer is preferably from 33.3 to 50 at %, particularly preferably from 33.3 to 40 at %, based on the total contained elements (100 at %), from the viewpoint of adhesion to a cushion material.

The content of Si in the STO layer is preferably at least 3.3 at %, particularly preferably at least 10 at %, based on the total contained elements (100 at %), from the viewpoint of adhesion to the cushion material. It is preferably at most 30 at %, particularly preferably at most 23.3 at %, from the viewpoint of film forming property. Further, the ratio of Si and Sn present in the STO layer is preferably such that Si:Sn is 1:9 to 9:1, more preferably from 3:7 to 7:3, by atomic ratio.

The thickness of the layer 14 containing Si is preferably at least 1 nm, particularly preferably at least 3 nm, from the viewpoint of adhesion to a cushion material, and it is preferably at most 100 nm, particularly preferably at most 60 nm, from the viewpoint of film forming property.

The method of forming the layer 14 containing Si is preferably a dry system method.

The dry system method may, for example, be a vacuum deposition method, a sputtering method, a CVD method or an ion plating method. The vacuum deposition method or the sputtering method is preferred, and the sputtering method is particularly preferred. The sputtering method is excellent in productivity and is widely industrially used. By such a method, it is possible to obtain a highly dense layer 14 containing Si, which has a high adhesion to the substrate 12 and has a uniform film thickness. The sputtering method may, for example, be a direct-current sputtering method or a high-frequency sputtering method. The direct-current sputtering method is preferred since it is possible to efficiently form a film with a high film forming rate on a substrate having a large area.

The method of forming a $SiO_x$ layer may, for example, be (i) a vacuum deposition method using $Si/SiO_2$ as an evaporation material, (ii) a high-frequency sputtering method (a reactive sputtering method) carried out in an atmosphere containing oxygen by using a Si target or (iii) a high-frequency sputtering method carried out in an atmosphere containing no oxygen by using a $SiO_x$ target. From the viewpoint of the film forming property, (i) the vacuum deposition method is preferred.

The method of forming a STO layer may, for example, be a reactive sputtering method carried out in an atmosphere containing oxygen by using a Si/Sn mixture target.

In a case where the Si/Sn mixture target is used, as is different from the case of using a Si target, the direct-current sputtering method will be available for reasons such as improvement of conductivity of a target, whereby it is possible to increase the film forming rate.

The Si/Sn mixture target may be one in a mixture state or one in an alloy state. The Si/Sn mixture target may be obtained by forming the mixture of Si and Sn by a CIP method (a Cold Isostatical Press method) or a warm press method (a method of press-molding at a temperature just below the melting point of Sn).

The above-described release film 10 comprises the layer 14 containing Si having a high affinity for a cushion material made of silicone rubber, whereby the release film 10 is adhered to the cushion material via the layer 14 containing Si by the first hot press. As a result, it will not be necessary to set or change the release film 10 for every hot press.

Further, since the layer 14 containing Si of the release film is not adhered to the cushion material by an adhesive, the release film 10 can be easily removed from the cushion material. As a result, when unevenness of a flexible printed board main body is transferred to the release film 10 and the release film 10 is required to be changed, it will be easy to change the release film 10.

Releasable Cushion Material

The releasable cushion material of the present invention is a cushion material for hot press wherein the release film of the present invention is provided on a surface of the cushion material made of silicone rubber so that the layer containing Si is preferably located on the cushion material side.

Figure 2:
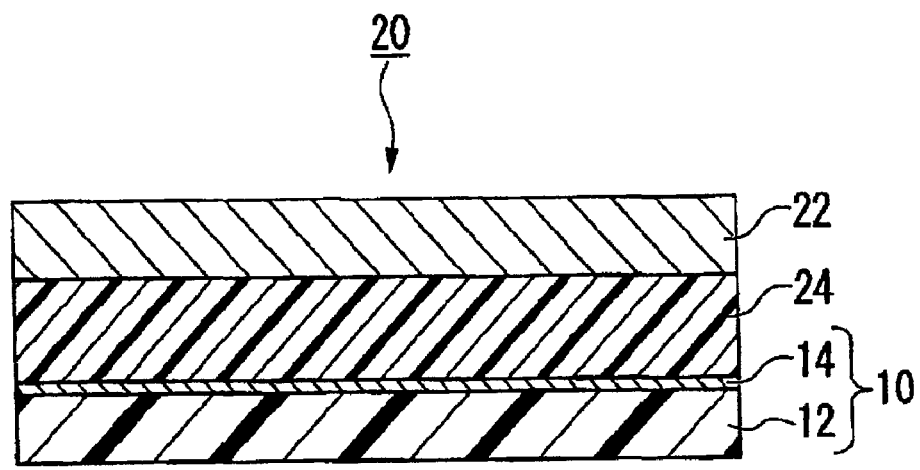
FIG. 2 is a schematic cross-sectional view illustrating one embodiment of the releasable cushion material of the present invention.

FIG. 2 is a schematic cross-sectional view illustrating one embodiment of the releasable cushion material of the present invention. A releasable cushion material 20 is one wherein the release film 10 is provided on a surface of a cushion material 24 having an aluminum sheet 22 lined so that the layer 14 containing Si is located on the cushion material 24 side.

The silicone rubber may, for example, be polydimethylsiloxane or its derivative.

As the case requires, in the cushion material 24, a known additive, etc. may be incorporated within a range not to impair the function of the cushion material 24.

With respect to the adhesion between the release film 10 and the cushion material 24, the release film 10 and the cushion material 24 may simply be adhered to each other without using an adhesive or the like, since the release film 10 has a layer 14 containing Si which has high affinity for the cushion material 24 made of silicone rubber. The release film 10 and the cushion material 24 may be adhered to each other before hot press or at the time of the first hot press.

With the above-described releasable cushion material 20, the release film 10 can easily be removed from the cushion material 24, and therefore, when unevenness of a flexible printed board main body is transferred to the release film 10, it is sufficient to simply change the release film 10. As a result, it is possible to reduce the frequency of changing the cushion material 24.

Process for Producing Printed Board

The process for producing a printed board of the present invention is a process for producing a printed board, wherein, when a laminate of a printed board main body and coverlay films is sandwiched between two press boards and subjected to hot press, cushion materials made of silicone rubber are interposed between the laminate and the press boards, and the mold release film of the present invention is disposed on a surface of the coverlay film side of at least one cushion material so that the layer containing Si is located on the cushion material side.

The printed board may, for example, be a flexible printed board, a multilayer printed board or a printed-wiring board.

Now, one embodiment of the process for producing a printed board of the present invention will be described with reference to drawings.

Figure 3:
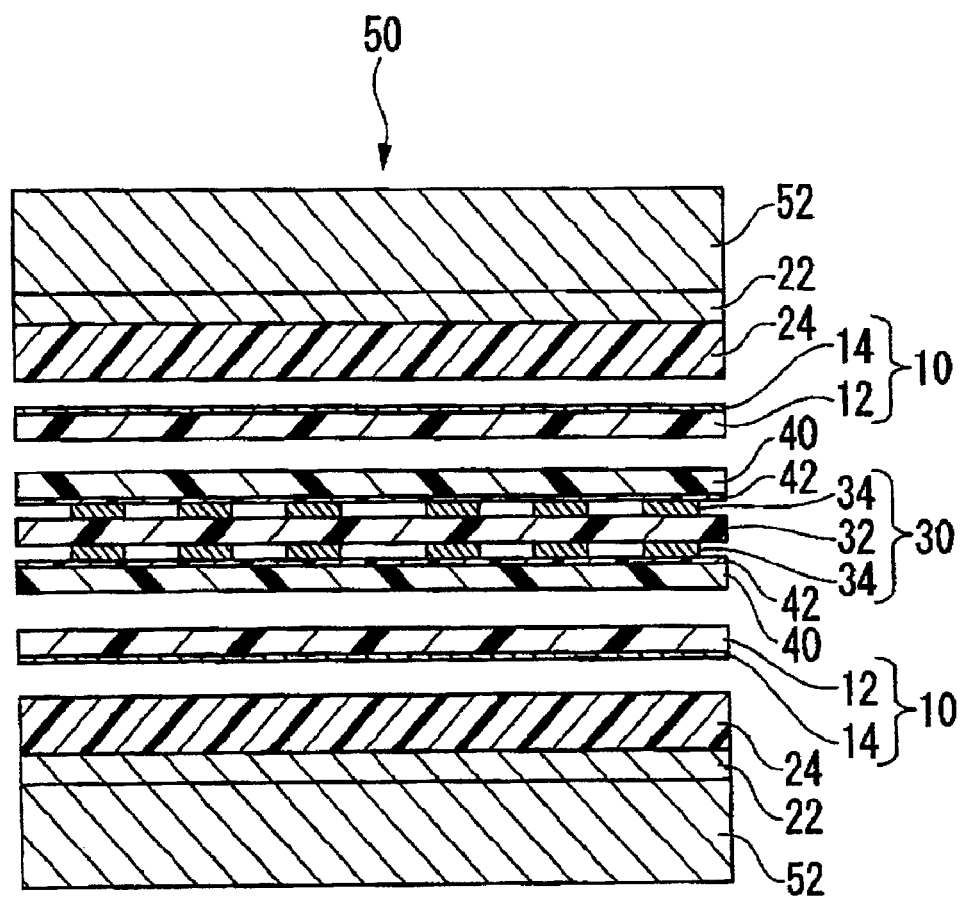
FIG. 3 is a schematic cross-sectional view illustrating one embodiment of the process for producing a printed board of the present invention.

FIG. 3 is a schematic cross-sectional view illustrating an embodiment of the process for producing a flexible printed board wherein both sides of a flexible printed board main body having circuits are formed are covered with coverlay films.

First, the flexible printed board main body 30 having a copper foil circuit 34 formed on each side of a polyimide substrate 32 is sandwiched between coverlay films 40 each having an adhesive layer 42 formed on one side of each film, to obtain a laminate.

Then, the release films 10 are disposed between cushion materials 24 and 24 of a press machine 50 wherein the cushion materials 24 and 24 each lined with an aluminum sheet 22 are provided between press boards 52 and 52. At that time, each release film 10 is disposed so that the layer 14 containing Si is located on the cushion material 24 side.

Then, in the absence of the laminate, hot press is carried out in this state to adhere the release film 10 and the cushion material 24.

Then, the above laminate is disposed between the release films 10 and 10 adhered to the cushion materials 24 and 24 and subjected to hot press to press-bond the coverlay films 40 to the flexible printed board main body 30 to obtain a flexible printed board.

Figure 4:
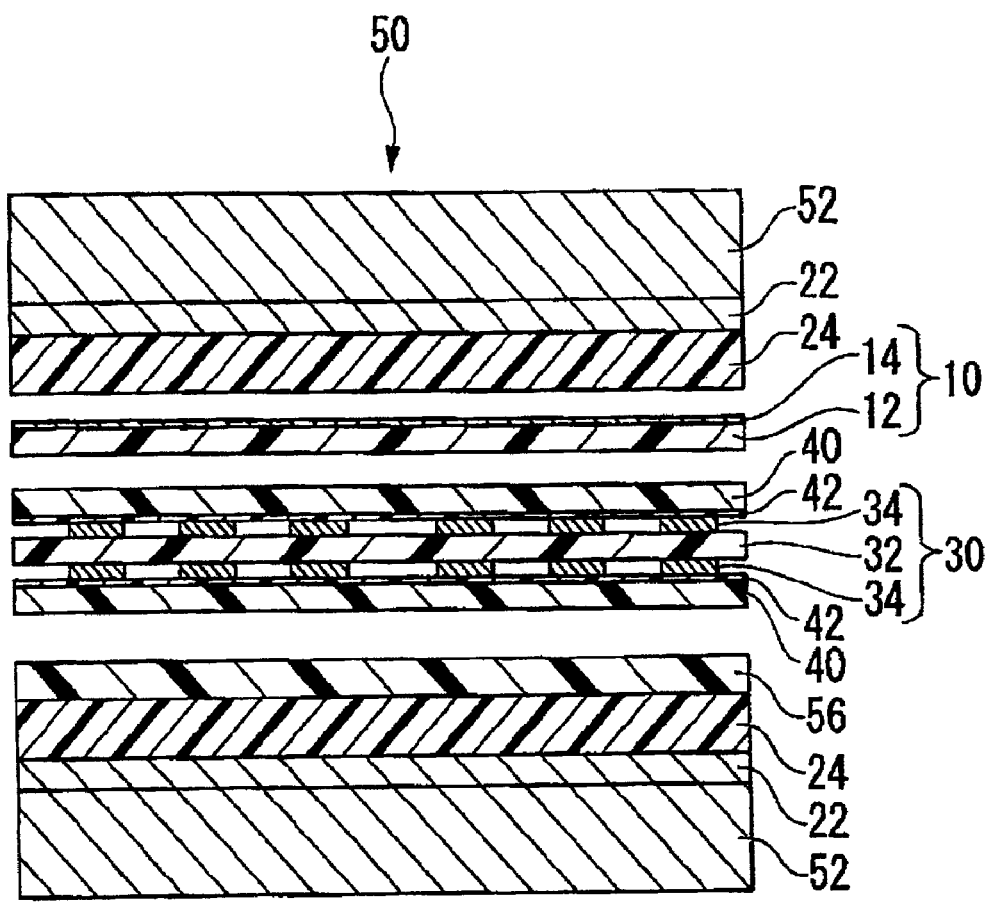
FIG. 4 is a schematic cross-sectional view illustrating another embodiment of the process for producing a printed board of the present invention.

FIG. 4 is related to the process for producing a flexible printed board wherein both sides of a flexible printed board main body having circuits formed thereon are covered with coverlay films, and it is a schematic cross-sectional view illustrating an embodiment of using the release film on only one side of the flexible printed board.

First, the flexible printed board main body 30 having copper foil circuits 34 formed on both sides of a polyimide substrate 32 is sandwiched between coverlay films 40 each having an adhesive layer 42 formed on one side of each film to obtain a laminate.

Then, the laminate is disposed between cushion materials 24 and 24 of a press machine 50 wherein the cushion materials 24 and 24 each lined with an aluminum sheet 22 are provided between the press boards 52 and 52, followed by hot press to press-bond the coverlay films 40 to the flexible printed board main body 30 to obtain the flexible printed board.

At the time of hot press, the release film 10 is disposed between the upper side cushion material 24 and coverlay film 40 of the laminate so that the layer 14 containing Si is located on the cushion material 24 side. Further, a glass fiber-reinforced PTFE film 56 is disposed between the lower side cushion material 24 and coverlay film 40 of the laminate.

Figure 5:
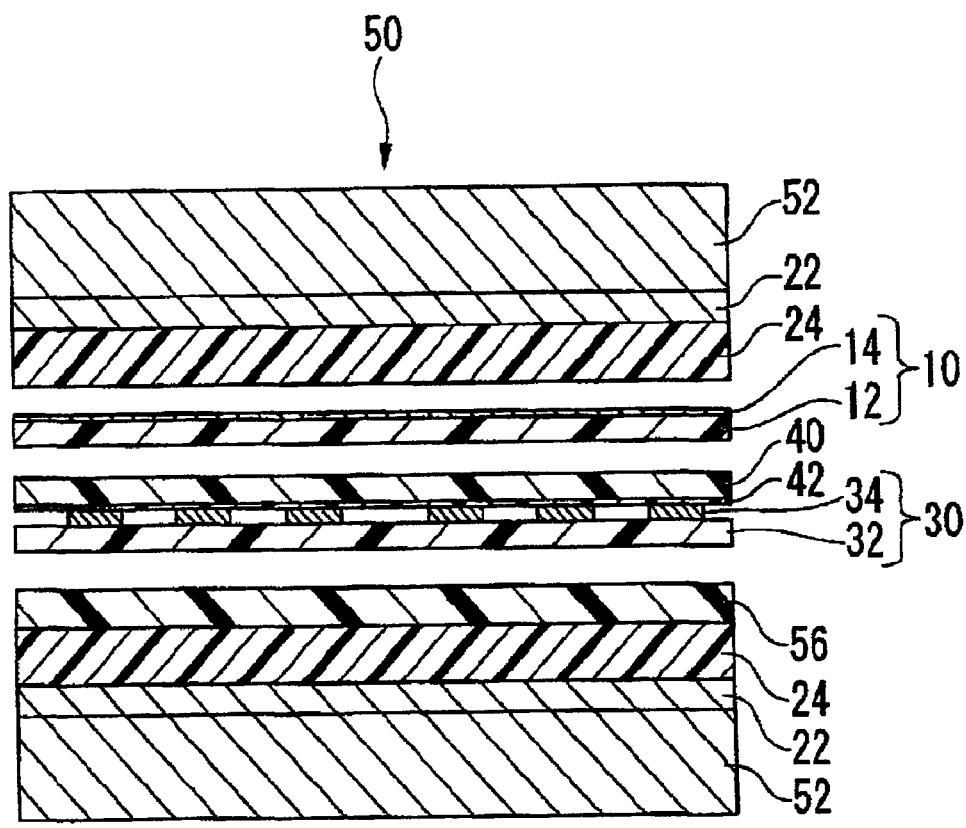
FIG. 5 is a schematic cross-sectional view illustrating another embodiment of the process for producing a printed board of the present invention.

FIG. 5 is a schematic cross-sectional view illustrating an embodiment of the process for producing a flexible printed board wherein one side of a flexible printed board main body having a circuit formed thereon is covered with a coverlay film.

First, the flexible printed board main body 30 having a copper foil circuit 34 formed on one side of a polyimide substrate 32 is covered with a coverlay film 40 having an adhesive layer 42 formed, so as to cover the circuit 34, to obtain a laminate.

Further, the laminate is disposed between cushion materials 24 and 24 of a press machine 50 wherein the cushion material 24 and 24 each lined with the aluminum sheet 22 are provided between the press boards 52 and 52, followed by hot press to press-board the coverlay film 40 to the flexible printed body main body 30 to obtain a flexible printed board.

At the time of hot press, the release film 10 is disposed between the upper side cushion material 24 and the coverlay film 40 of the laminate so that the layer 14 containing Si is located on the cushion material 24 side. Further, a glass fiber-reinforced PTFE film 56 is disposed between the lower side cushion material 24 and the laminate.

The coverlay film 40 may, for example, be a polyimide film or a polyester film.

As the adhesive layer 42, an epoxy resin may be mentioned.

In the above-described process for producing a printed board of the present invention, the release film 10 of the present invention is disposed on a surface, on the coverlay film 40 side, of the cushion material 24 made of silicone rubber so that the layer 14 containing Si is located on the cushion material 24 side, whereby the release film 10 is adhered to the cushion material 24 via the layer 14 containing Si by the first hot press. As a result, it will not be necessary to set or change the release film 10 for every hot press, and it is possible to produce the flexible printed board main body 30 with good productivity and low cost.

Further, the layer 14 containing Si of the release film 10 is adhered to the cushion material 24 without an adhesive or the like, whereby the release film 10 can easily be removed from the cushion material 24. As a result, when unevenness of the flexible printed board main body 30 is transferred to the release film 10 and the release film 10 is required to be changed, the release film 10 can easily be changed, and it is possible to produce the flexible printed board main body 30 with good productivity and low cost.

EXAMPLES

Now, the present invention will be described in further detail with reference to Examples, but the present invention is by no means restricted by the following Examples.

Examples 1 and 2 are Examples of the present invention, and Example 3 is a Comparative Example.

Example 1

One side of an ETFE film (tradename Fluon ETFE, manufactured by Asahi Glass Company, Limited) having a thickness of 100 μm was subjected to corona discharge treatment with a discharge amount of 40 W·min/m².

By heating a mixture of Si and $SiO_2$ as an evaporation material by using an electron beam, a 40 nm $SiO_2$ film by a vacuum deposition method was formed on the corona discharge-treated side of the ETFE film to obtain a release film (1).

A flexible printed board main body having copper foil circuits formed on both sides of a polyimide substrate was sandwiched by coverlay films made of a 12.5 μm polyimide substrate having a 15 μm heat-sensitive epoxy adhesive applied on one side to obtain a laminate.

Then, by using the press machine 50 shown in FIG. 3, in a state where the release films (1) were disposed on both sides of the laminate so that the layers containing Si were located on the cushion material sides, hot press was carried out under such conditions that the press temperature was 180° C., the press pressure was 4 MPa and the press time was 3 minutes.

The hot press was repeatedly carried out. The adhesion of the release film (1) to the cushion material and unevenness of the release film (1) after 160 times of hot press and 180 times of hot press were visually evaluated. Further, the releasability of the release film (1) from the cushion material after 160 times of hot press and 180 times of hot press was evaluated. The results are shown in Table 1.

The adhesion should better be over the entire surface. Further, the releasability should better be "manually releasable".

Example 2

One side of an ETFE film (tradename Fluon ETFE, manufactured by Asahi Glass Company, Limited) having a thickness of 100 μm was subjected to corona discharge treatment under the same condition as in Example 1.

On the corona discharge-treated surface of the ETFE is film, a 5 nm STO film was formed by a direct-current sputtering method by using a DC magnetron system roll coater, to obtain a release film (2). Film forming was carried out in an atmosphere of a mixed gas of 75 vol % of argon gas and 25 vol % of oxygen gas, by using a Si/Sn alloy target (composition: 50 at % of Si and 50 at % of Sn) as the target and under a power density condition of 4 kw/m.

Hot press was carried out in the same manner as in Example 1 except for using the release film (2) instead of the release film (1), and evaluation was carried out.

The results are shown in Table 1.

Example 3

One side of the ETFE film (tradename Fluon ETFE, manufactured by Asahi Glass Company, Limited) having a thickness of 100 μm was subjected to corona discharge treatment under the same condition as in Example 1.

Hot press was carried out in the same manner as in Example 1 except that the ETFE film was used instead of the release film (1) and the ETFE films were disposed on both sides of the laminate so that the corona discharge-treated surface was located on the cushion material side. The ETFE film did not adhere to the cushion material, and immediately after the first hot press, the ETFE film was entirely peeled off from the cushion material.

TABLE 1

| | Layer containing Si | Number of times of press | Adhesion | Unevenness | Releasability |
|---|---|---|---|---|---|
| Ex. 1 | $SiO_2$ film | 160 | Only end portion peeled | Medium | Manually releasable |
| | | 180 | Only end portion peeled | Large | Manually releasable |
| Ex. 2 | STO film | 160 | Only end portion peeled | Medium | Manually releasable |
| | | 180 | Only end portion peeled | Large | Manually releasable |
| Ex. 3 | None (Corona treated surface) | 1 | Entirely peeled | Small | — |

INDUSTRIAL APPLICABILITY

The release film of the present invention is useful as a release film to be used for a process for producing a printed board by press-bonding a coverlay film to a printed board main body.

The entire disclosure of Japanese Patent Application No. 2006-104018 filed on Apr. 5, 2006 including specification, claims, drawings and summary is incorporated herein by reference in its entirety.

What is claimed is:

1. A cushion body, consisting of:
    a cushion; and
    a release film layer provided on and adhered to a surface of the cushion; wherein
    the cushion comprises a silicon rubber, and
    the release film comprises:
        a fluororesin substrate coated with a layer consisting of oxides of metals comprising $SiO_x$ and an oxide of tin;
    the metal oxide layer comprising $SiO_x$ and an oxide of tin is in contact with the cushion surface, and
    no adhesive is present between the cushion material and the layer comprising $SiO_x$ and an oxide of tin,
    the surface of the cushion provided with the release film layer is a surface to contact a coverlay film used for bonding a printed board in a hot press,
    x is a value from 1 to 2,
    the layer comprising $SiO_x$ and oxide of Sn is obtained by a sputtering method, and
    a Si content is from 3.3 to 30 at % based on total elements contained in the layer comprising $SiO_x$ and oxide of tin.

2. The cushion body according to claim 1, wherein a thickness of the metal oxide layer comprising $SiO_x$ and oxide of tin is from 1 to 100 nm.

3. The cushion body according to claim 1, wherein the fluororesin comprises tetrafluoroethylene.

4. The cushion body according to claim 1, wherein the fluororesin is a tetrafluoroethylene/ethylene copolymer.

* * * * *